US006825594B1

(12) United States Patent
Thurn

(10) Patent No.: US 6,825,594 B1
(45) Date of Patent: Nov. 30, 2004

(54) ULTRASONIC TRANSDUCER

(75) Inventor: Rudolf Thurn, Pressath (DE)

(73) Assignee: Siemens Aktiengesellschaft, Munich (DE)

( * ) Notice: Subject to any disclaimer, the term of this patent is extended or adjusted under 35 U.S.C. 154(b) by 40 days.

(21) Appl. No.: 10/148,018

(22) PCT Filed: Nov. 14, 2000

(86) PCT No.: PCT/DE00/04001

§ 371 (c)(1), (2), (4) Date: Oct. 7, 2002

(87) PCT Pub. No.: WO01/38011

PCT Pub. Date: May 31, 2001

(30) Foreign Application Priority Data

Nov. 26, 1999 (DE) ........................................ 199 57 125

(51) Int. Cl.[7] ........................ H04R 17/00; H01L 41/053

(52) U.S. Cl. ........................ 310/334; 310/327; 310/348; 367/157

(58) Field of Search ................................ 310/327, 334, 310/345, 348; 367/155, 157

(56) References Cited

U.S. PATENT DOCUMENTS

| | | | | |
|---|---|---|---|---|
| 2,770,741 A | * | 11/1956 | Vore et al. | 310/338 |
| 3,480,906 A | | 11/1969 | Thompson | 367/158 |
| 4,297,607 A | | 10/1981 | Lynnworth et al. | 310/334 |
| 4,446,395 A | * | 5/1984 | Hadjicostis | 310/327 |
| 5,176,140 A | * | 1/1993 | Kami et al. | 600/459 |
| 5,329,682 A | | 7/1994 | Thurn et al. | 29/25.35 |
| 5,335,209 A | | 8/1994 | Jaenke et al. | 367/155 |
| 5,339,292 A | * | 8/1994 | Brown et al. | 367/176 |
| 5,545,942 A | * | 8/1996 | Jaster et al. | 310/341 |
| 6,370,086 B2 | * | 4/2002 | Li | 367/178 |
| 6,396,199 B1 | * | 5/2002 | Douglas et al. | 310/335 |

FOREIGN PATENT DOCUMENTS

| | | | |
|---|---|---|---|
| DE | 25 41 492 | 3/1977 | H04R/1/34 |
| DE | 38 32 947 C2 | 3/1990 | G01F/1/66 |
| DE | 296 14 691 U1 | 11/1996 | H04R/17/00 |
| DE | 196 30 350 C2 | 1/1998 | H04R/17/00 |
| DE | 198 09 206 A1 | 9/1999 | G10K/9/122 |
| EP | 553 325 A1 | 8/1993 | B06B/1/06 |

* cited by examiner

*Primary Examiner*—Thomas M. Dougherty
(74) *Attorney, Agent, or Firm*—Harness, Dickey & Pierce, P.L.C.

(57) ABSTRACT

An ultrasonic transducer includes a housing, in which an ultrasonic oscillator is secured with at least one of a non-positive and positive fit and at least three layers with acoustic wave impedances that vary to alternating degrees. The layers are arranged such that the ultrasonic oscillator is embedded in a first relatively acoustically soft layer, a second layer, which includes at least one relatively acoustically hard material, surrounds the first layer, and a third relatively acoustically soft layer at least partially surrounds the second layer.

20 Claims, 1 Drawing Sheet

ULTRASONIC TRANSDUCER

This application is the national phase under 35 U.S.C. §371 of PCT International Application No. PCT/DE00/04001 which has an International filing date of Nov. 14, 2000, which designated the United States of America, the entire contents of which are hereby incorporated by reference.

FIELD OF THE INVENTION

The invention generally relates to an ultrasonic transducer. More particularly, it relates to one for use in proximity switches.

BACKGROUND OF THE INVENTION

Ultrasonic proximity switches are used in automation engineering, mainly for contactlessly sensing the presence or distance of objects. Depending on the measuring task, the bound method or the echo-delay-time method are used. In the bound method, an ultrasonic transmitter sends out signals which reach an ultrasonic receiver on a direct path. The object to be sensed interrupts the sound path and is detected in this way. In the echo-delay-time method, on the other hand, the ultrasonic echo reflected by the object to be sensed is received and the distance of the object is determined from the signal delay time between transmission and reception.

Key components for both methods are the ultrasonic transducers. In the transmitting case, they are used for converting electric signals into sound waves and, in the receiving case, they are used for converting sound waves into electric signals. In the case of devices based on the echo-delay-time method, often one and the same transducer is used alternately for transmission and reception. This reduces the expenditure on equipment, but fixes a minimum distance below which no measurements are possible because of the unavoidable decay processes of the transducer after the transmitting cycle.

Ultrasonic transducers are available in various technical forms. For industrial use, solid-state transducers are usually used, because of their robustness. They basically include a piezoceramic device as an element for converting between electric signals and acoustic signals and a resonant adapter layer, with which the transfer of sound to the air is optimized.

Typical examples of arrangements of this type are shown, inter alia, by DE 25 41 492 B2 and DE 196 30 350 C2. For use in practice, the ultrasonic transducer must be secured in a suitable way, without its function being impaired as a result. For this purpose, plastic moldings and polymer foams are usually used, see for example DE 198 09 206 A1. The polymer foams also bring about a desired mechanical insulation of the ultrasonic transducer. Furthermore, electrical shielding can be performed by metal pots additionally introduced into the arrangement.

Ultrasonic transducers of the type described are used in large numbers in industrial proximity switches and have proven successful in operation. In the course of miniaturization of the devices, however, problems are increasingly being caused by the coupling-over of structure-borne sound to the ultrasonic transducer, since the layer thickness of the enveloping polymer foam layers decreases, and consequently so does their insulating capacity with respect to an undesired radial flow of sound. The devices are consequently sensitive to disruptive noises in the region of their operating frequency, which can be mechanically coupled into the proximity switches from surrounding machine parts if fixed mounting is used. Furthermore, there is the risk of part of the transmitted sound escaping laterally into the surrounding machine parts and leading there to undefined echoes, which in turn can be coupled back to the proximity switch.

The problem described has so far not been solved satisfactorily. Improvised attempts to do so use a reduced sensitivity of the proximity switch, which however is disadvantageous for normal operation. A further attempted solution is to make the ultrasonic transducer protrude from the front of the housing sleeve, so that the transmission path between the acoustically active part of the transducer and the surrounding structural parts via which the structure-borne sound could be transferred is increased.

One particular implementation of this principle is specified in DE 38 32 947 C2, in which the adapter layer is extended in a thin-walled and tubular form over the rear side of the piezoceramic device, this extension amounting to approximately one fourth of the length of the sound path. In this region, the transducer is held via a flexible clamping ring, whereby the transmission of structure-borne sound is distinctly reduced. Disadvantages of solutions of this type are that the transducer protruding from the contour of the device is susceptible to damage and often the overall length of the proximity switches is also increased.

SUMMARY OF THE INVENTION

It is therefore an object of an embodiment of the present invention to specify a device for transmitting and receiving ultrasound. Preferably this is used for ultrasonic proximity switches. Even more prefereably, the device is one which is insensitive to transmission of structure-bome sound and/or, at the same time, one which avoids at least one of the disadvantages of the described known attempted solutions.

At least one of the objects can be achieved according to an embodiment of the invention by an ultrasonic device. Preferably, the device includes:

a) a housing in which an ultrasonic oscillator, formed by a piezoceramic device and an adapter layer, is secured with a nonpositive and/or positive fit, b) the nonpositive and/or positive fit is achieved by at least four layers with acoustic wave impedances that vary to alternating degrees, c) the layers are arranged in the following sequence, considered from the ultrasonic oscillator, d) the ultrasonic oscillator is embedded in a first acoustically soft layer with at least one flexible insulating material as a component part, e) the first layer is surrounded by a second layer, which consists of at least one acoustically hard material, preferably metal, f) lying around the second, acoustically hard layer is a third, acoustically soft layer, which surrounds the second layer at least in the direction directed from the ultrasonic oscillator radially outward toward the housing and which comprises one or more plastics in foam form, the density of which is always less than 0.6 $kg/dm^3$, and g) the third layer is surrounded at least partially by a fourth layer with a high acoustic wave impedance.

Acoustically soft and acoustically hard materials are understood as meaning those materials of which the wave impedance, defined as the product of the material density and material wave velocity, is very low or very high, respectively. The succession of layers, according to an embodiment of the invention, with acoustically soft and acoustically hard materials in alternation, has the effect that the structure-borne sound coupled over from the ultrasonic oscillator outward into the housing and the flow of structure-borne sound directed back to the ultrasonic oscillator encounter a great mismatch; at the layers of differing acoustic hardness there always occurs almost total reflection in each case, so that the overall transmission is reduced to a minimum. The structure-borne sound insulation is in this case all the better the greater the differences in the wave impedances at the individual layers.

The fourth layer may represent a housing of the ultrasonic transducer. The mismatches of the wave impedance in the layers one to three are generally already so effective in the construction according to an embodiment of the invention that, for this layer, even conventional plastics with a wave impedance which is lower than that of metals are adequate to provide structure-borne sound insulation.

It is particularly advantageous if the third layer of the ultrasonic transducer includes a plastic with a density of less than 0.2 kg/dm$^3$, since particularly good structure-borne sound decoupling is achieved for this. This increased structure-borne sound decoupling may be necessary in the case of installation conditions of the transducer that are very unfavorable in terms of structure-borne sound and/or in the case of very high signal amplification of the sensor electronics.

In the production of the transducers, it is only with some effort that layers with such low densities can be introduced as a casting compound, especially if the layer thickness in the case of small structural forms is very thin. It is therefore advantageous to use prefabricated foam moldings for the third layer.

Furthermore, it is particularly advantageous if enamel-insulated high-frequency stranded wire with a total cross section of less than 0.05 mm$^2$ is used for the electrical connection of the ultrasonic transducer. In the case of conventional connecting leads, structure-borne sound is transmitted to a disruptive extent via the conductor or the stranded wire and/or via the insulation, which generally includes plastics, such as for example PVC, PU, Teflon or the like.

BRIEF DESCRIPTION OF THE DRAWINGS

An exemplary embodiment of the invention is explained in more detail below with reference to the drawings, in which.

DETAILED DESCRIPTION OF THE PREFERRED EMBODIMENTS

Figure 1:
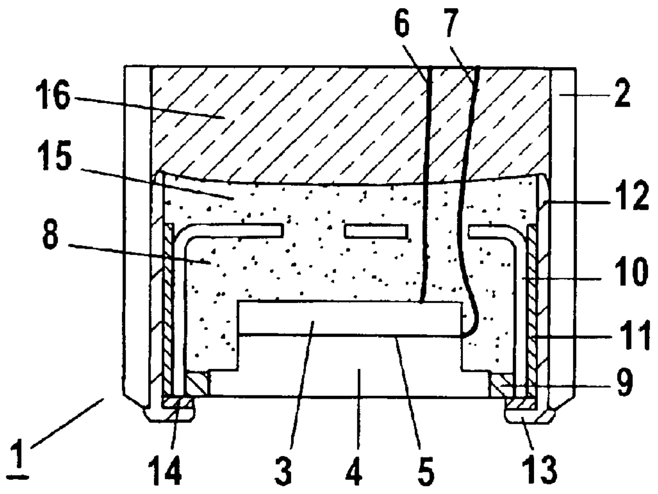
FIG. 1 shows a sectional representation of the ultrasonic transducer according to an embodiment of the invention in a first embodiment.

FIG. 1 shows the sectional representation of an ultrasonic transducer 1 according to an embodiment of the invention, which is located as an end termination at the end of a metal sleeve 2 serving as a device housing; for example, the metal sleeve may be an M18 threaded sleeve with an inside diameter of about 16 mm. The active part of the ultrasonic transducer 1 is, in a known way, the composite assembly referred to as an ultrasonic oscillator, including a piezoceramic device 3 and an adapter layer 4, which are interconnected, for example by an adhesive bond 5.

The electrodes of the piezoceramic device 3 are connected via leads 6, 7 to an electronic circuit (not represented any further) for preparing the transmitted and received signals. The leads 6, 7 include enamel-insulated HF stranded wires with a total cross section of 0.02 mm$^2$ in each case.

The ultrasonic oscillator including the piezoceramic device 3 and the adapter layer 4 is surrounded in its upper part by a casting compound 8, which advantageously takes the form of blown or syntactic foam with a low acoustic wave impedance. In the lower part, the ultrasonic oscillator including the piezoceramic device 3 and the adapter layer 4 is surrounded by a foam ring 9, which likewise has a low acoustic wave impedance and at the same time may have a centering function according to DE 198 09 206 A1.

The casting compound 8 and the foam ring 9 represent the first layer of at least four layers, which surrounds the ultrasonic oscillator according to the teaching of an embodiment of the invention. The metal pot 10 around the first layer also serves in a known way for the electrical shielding of the ultrasonic oscillator including the piezoceramic device 3 and the adapter layer 4, but has within the layer construction according to an embodiment of the invention the described additional function of structure-borne sound insulation by mismatching.

It includes, for example, 0.5 mm thick sheet steel and has, as a result of the material data of the metal, a high acoustic wave impedance, and forms the second layer. The openings in the pot 10, necessary for leading through the leads 6, 7 and for pouring in the flexible insulating compound 8, are to be made as small as possible, to avoid structure-borne sound coupling-over, and, if required, be closed at least partially by suitable measures, for example by adhesively bonding or soldering on an acoustically hard cover.

The metal pot 10 is surrounded in the radial direction by a tubular foam ring 11, which in turn has a very low acoustic wave impedance with a density of, for example, 50 kg/m$^3$, has in the radial direction a thickness of, for example, 0.5 mm and forms the third layer of the at least four layers according to the teaching of an embodiment of the invention. The fourth layer is represented by the plastic ring 12, which has a high acoustic wave impedance in comparison with the third layer and is held with a nonpositive fit in the metal sleeve 2.

In the axial direction, the described arrangement is held with a positive fit by the undercut 13 of the plastic ring 12, the foam ring 14 having a low acoustic wave impedance with a density of, for example, 180 kg/m$^3$ and, in the axial direction between the metal pot and the undercut 13 of the plastic ring 12, likewise forming the third layer of the at least four layers according to the teaching of an embodiment of the invention. For the elements 11 and 14, a foam with a closed-cell structure is advantageously taken, in order that moisture cannot penetrate from the outside and form bridges for structure-borne sound.

Suitable materials for the acoustically soft third layer are, for example, PE foams, PVC foams, PU foams, silicone foams, types of cellular rubber etc., for example as blown foam or as syntactic foam fitted as moldings and/or introduced as casting compound. Foams of this type can be produced in various hardnesses and in densities of down to below 20 kg/m$^3$, with correspondingly extremely low wave impedances, so that extremely good structure-borne sound insulation values can be achieved with them.

It is advantageous to apply directly behind the metal pot 10 in the axial direction of the arrangement a further casting compound 15 in foam form, with a low acoustic wave impedance, which, corresponding to the teaching of an embodiment of the invention, with a relatively high acoustic wave impedance in comparison with the following device encapsulation 16, represents the third layer of the at least four layers.

When choosing the layer thicknesses, it must be ensured that no multiples of half the sound wavelength occur in the respective layer. To avoid structure-borne sound transmission through the connecting leads 6, 7, it is advantageous to make them from enamel-insulated high-frequency stranded wire with a total cross section of less than 0.05 $mm^2$.

Figure 2:
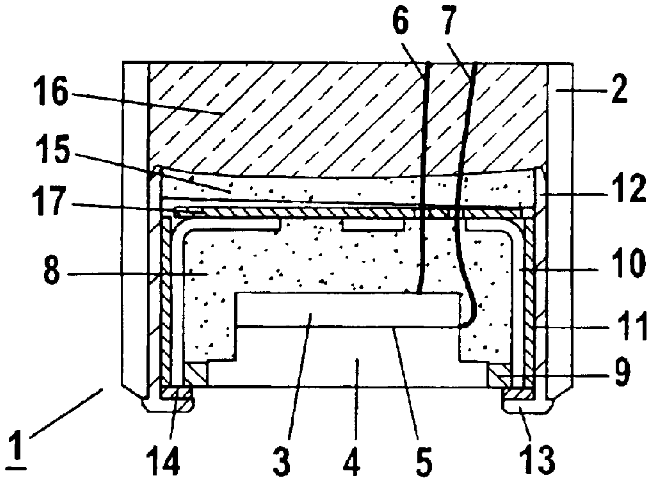
FIG. 2 shows a sectional representation of a further embodiment with an additional foam element and FIG. 3 shows a sectional representation of a further embodiment with an additional annular air gap and an opening which is closed by a cover.

The exemplary embodiment according to FIG. 2 differs from the exemplary embodiment according to FIG. 1 only in that here, in the rear region of the ultrasonic oscillator, the third layer is formed by a foam part 17. A foam layer 17 of this type may be formed as a prefabricated molding and may have a still lower wave impedance than, for example, the casting compound 15 in foam form, whereby the decoupling of the structure-bome sound can be further improved. Otherwise, the two embodiments are the same.

In the exemplary embodiment according to FIG. 3, the foam ring 11 covers in the axial direction only the upper part of the lateral surface of the sheet-metal pot 10, and below that there is an annular air gap 18, which has an even much lower wave impedance than foam. As a result, the mismatching of the wave impedance, and consequently the degree of structure-borne sound insulation, is additionally increased in comparison with the exemplary embodiment according to FIG. 1. The third layer according to the teaching of an embodiment of the invention is made up in the radial direction by the foam ring 11 and the air gap 18. The foam ring 11 may also comprise two or more part-elements, between which there may be air gaps to increase the mismatching. As an additional measure, an opening in the sheet-metal pot 10, necessary for the pouring-in of the casting compound 8, has been closed by an acoustically hard cover 19, to avoid possible coupling of structure-borne sound through this opening into the casting compound 15.

Figure 3:
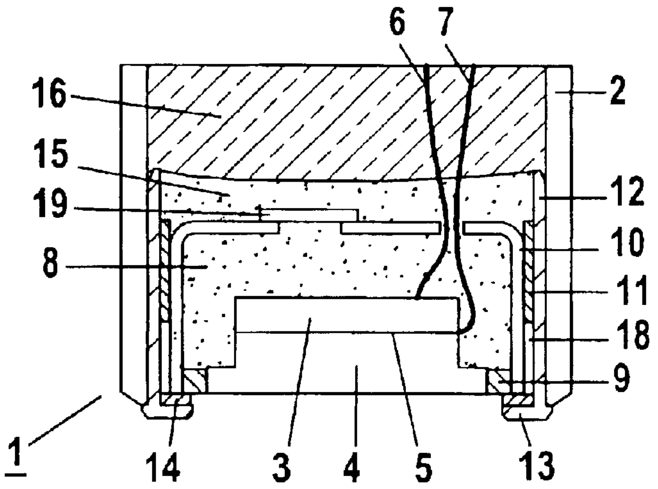

Even though the described exemplary embodiments from FIG. 1 to FIG. 3 are based on rotationally symmetrical transducer arrangements, the described measures according to an embodiment of the invention for reducing structure-bome sound are not restricted to these, but are also valid in the case of any desired transducer arrangements.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An ultrasonic transducer, comprising:

a housing, in which an ultrasonic oscillator is secured with at least one of a nonpositive and positive fit; and at least four layers with acoustic wave impedances that vary to alternating degrees, adapted to achieve the fit, wherein the layers are arranged such that the ultrasonic oscillator is embedded in a first relatively acoustically soft layer with at least one flexible insulating material as a component part, wherein the first layer is surrounded by a second layer which includes at least one relatively acoustically hard material, wherein a third relatively acoustically soft layer surrounds the second layer at least in the direction directed from the ultrasonic oscillator radially outward toward the housing, includes at least one plastic in foam form, the density of which is always less than 0.6 $kg/dm^3$, and wherein the third layer is surrounded at least partially by a fourth layer with a relatively high acoustic wave impedance.

2. The ultrasonic transducer as claimed in claim 1, wherein the third layer includes plastic in foam form with a density of less than 0.2 $kg/dm^3$.

3. The ultrasonic transducer as claimed in claim 1, wherein the third layer includes at least one prefabricated foam molding.

4. The ultrasonic transducer as claimed in claim 1, wherein enamel-insulated high-frequency stranded wire with a total cross section of less than 0.05 $mm^2$ is used for the electrical connection of the ultrasonic transducer.

5. A proximity switch including the ultrasonic transducer of claim 1.

6. The ultrasonic transducer as claimed in claim 1, wherein the at least one acoustically hard material is metal.

7. The ultrasonic transducer as claimed in claim 2, wherein the third layer includes at least one prefabricated foam molding.

8. The ultrasonic transducer as claimed in claim 2, wherein enamel-insulated high-frequency stranded wire with a total cross section of less than 0.05 $mm^2$ is used for the electrical connection of the ultrasonic transducer.

9. The ultrasonic transducer as claimed in claim 3, wherein enamel-insulated high-frequency stranded wire with a total cross section of less than 0.05 $mm^2$ is used for the electrical connection of the ultrasonic transducer.

10. A proximity switch including the ultrasonic transducer of claim 2.

11. A proximity switch including the ultrasonic transducer of claim 3.

12. A proximity switch including the ultrasonic transducer of claim 4.

13. A proximity switch including the ultrasonic transducer of claim 7.

14. The ultrasonic transducer as claimed in claim 1, wherein the ultrasonic transducer is formed by a piezoceramic device and an adapter layer.

15. An ultrasonic transducer, comprising:

a housing, in which an ultrasonic oscillator is secured with at least one of a nonpositive and positive fit; and at least three layers with acoustic wave impedances that vary to alternating degrees, adapted to achieve the fit, wherein the layers are arranged such that the ultrasonic oscillator is embedded in a first relatively acoustically soft layer including at least one flexible insulating material, wherein the first layer is surrounded by a second layer which includes at least one relatively acoustically hard material, wherein a third relatively acoustically soft layer at least partially surrounds the second layer and includes at least one plastic in foam form, the density of which is always less than 0.6 $kg/dm^3$, and wherein the third layer is surrounded at least partially by the housing.

16. The ultrasonic transducer of claim 15, wherein the third layer at least partially surrounds the second layer at least in the direction directed from the ultrasonic oscillator radially outward toward the housing.

17. The ultrasonic transducer of claim 15, wherein the housing layer acts as a fourth layer with a relatively high acoustic wave impedance.

18. A proximity switch including the ultrasonic transducer of claim 15.

19. The ultrasonic transducer of claim 16, wherein the housing layer acts as a fourth layer with a relatively high acoustic wave impedance.

20. A proximity switch including the ultrasonic transducer of claim 17.

* * * * *